(12) United States Patent
Nakayama et al.

(10) Patent No.: US 7,845,955 B2
(45) Date of Patent: Dec. 7, 2010

(54) CONDUCTIVE CONTACT HOLDER (75) Inventors: Hiroshi Nakayama, Nagano (JP); Kohei Hironaka, Nagano (JP); Yosuke Mabune, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 0 days.

(21) Appl. No.: 12/226,682

(22) PCT Filed: Apr. 25, 2007

(86) PCT No.: PCT/JP2007/058984

§ 371 (c)(1),
(2), (4) Date: Apr. 29, 2009

(87) PCT Pub. No.: WO2007/125974

PCT Pub. Date: Nov. 8, 2007

(65) Prior Publication Data
US 2009/0311890 A1    Dec. 17, 2009

(30) Foreign Application Priority Data
Apr. 28, 2006    (JP)  ............... 2006-126515

(51) Int. Cl.
H01R 12/00    (2006.01)
(52) U.S. Cl. ........................................ 439/66
(58) Field of Classification Search ............ 439/66, 439/91, 83, 607.1, 607.05, 607.12
See application file for complete search history.

(56) References Cited

U.S. PATENT DOCUMENTS

| | | | | |
|---|---|---|---|---|
| 2,853,656 | A | * | 9/1958 | Dowds ............ 361/784 |
| 4,390,220 | A | * | 6/1983 | Benasutti ........... 439/71 |
| 4,668,041 | A | * | 5/1987 | La Komski et al. .... 439/620.09 |
| 5,046,953 | A | * | 9/1991 | Shreeve et al. ......... 439/66 |
| 5,055,054 | A | * | 10/1991 | Doutrich ............ 439/66 |
| 5,061,192 | A | * | 10/1991 | Chapin et al. ......... 439/66 |
| 5,155,905 | A | * | 10/1992 | Miller, Jr. ........... 29/843 |
| 5,174,763 | A | | 12/1992 | Wilson |
| 5,302,853 | A | * | 4/1994 | Volz et al. ........... 257/707 |

(Continued)

FOREIGN PATENT DOCUMENTS

EP    0 462 706 A1    12/1991

(Continued)

OTHER PUBLICATIONS

International Search Report mailed Aug. 21, 2007, issued on PCT/JP2007/058984.

(Continued)

*Primary Examiner*—Neil Abrams
*Assistant Examiner*—Harshad C Patel
(74) *Attorney, Agent, or Firm*—Edwards Angell Palmer & Dodge LLP (57) ABSTRACT A conductive contact holder includes an insulating holder member and a conductive block member. The insulating holder member is made of an insulating material and includes a first insertion hole through which a signal conductive contact inputting and outputting a signal to and from a circuit is directly inserted over substantially its full length. The conductive block member is made of a conductive material and includes a second insertion hole through which the ground conductive contact is inserted in partial contact therewith.

6 Claims, 8 Drawing Sheets

U.S. PATENT DOCUMENTS

| | | | |
|---|---|---|---|
| 5,414,369 A * | 5/1995 | Kazama | 324/758 |
| 5,527,189 A * | 6/1996 | Middlehurst et al. | 439/607.14 |
| 5,672,062 A * | 9/1997 | Lindeman | 439/66 |
| 5,713,744 A * | 2/1998 | Laub | 439/71 |
| 6,022,225 A * | 2/2000 | Chapin et al. | 439/73 |
| 6,046,597 A * | 4/2000 | Barabi | 324/755 |
| 6,247,939 B1 * | 6/2001 | Bestul et al. | 439/66 |
| 6,749,441 B1 * | 6/2004 | Ma | 439/66 |
| 6,846,184 B2 * | 1/2005 | Fan et al. | 439/66 |
| 6,932,618 B1 * | 8/2005 | Nelson | 439/66 |
| 7,220,134 B2 * | 5/2007 | Goodman et al. | 439/70 |
| 7,470,149 B2 * | 12/2008 | Kazama et al. | 439/607.05 |
| 2003/0076124 A1 | 4/2003 | Zaiser | |
| 2007/0111560 A1 * | 5/2007 | Kazama et al. | 439/71 |
| 2008/0307646 A1 * | 12/2008 | Zaderej et al. | 29/874 |
| 2009/0023311 A1 * | 1/2009 | Goodman | 439/66 |
| 2009/0186495 A1 * | 7/2009 | Taylor | 439/66 |
| 2009/0221156 A1 * | 9/2009 | Lee et al. | 439/66 |
| 2010/0041251 A1 * | 2/2010 | Nakayama | 439/65 |

FOREIGN PATENT DOCUMENTS

| | | |
|---|---|---|
| EP | 1686385 | 8/2006 |
| JP | 2001-099889 | 4/2001 |
| JP | 2001-116806 A | 4/2001 |
| JP | 2005-049163 | 2/2005 |
| JP | 2005-156530 A | 6/2005 |
| TW | 20040133774 | 3/2006 |

OTHER PUBLICATIONS

Korean Office Action dated Aug. 20, 2010, issued in corresponding Korean Application No.: 10-2008-7028992.
Japanese Publication No. JP-2001-116806-A.
Japanese Publication No. JP-2005-156530-A.
Taiwanese Office Action dated Aug. 27, 2010, issued in corresponding Taiwanese Application No. 096114932.

* cited by examiner

CONDUCTIVE CONTACT HOLDER

FIELD OF THE INVENTION

The present invention relates to a conductive conduct holder that holds conductive contacts used for current testing of a circuit such as a semiconductor integrated circuit.

DESCRIPTION OF THE RELATED ART

Upon current testing of a semiconductor integrated circuit such as an integrated circuit (IC) chip, a conductive contact unit has been used that has a plurality of conductive contacts at predetermined positions corresponding to an arrangement pattern of external connecting electrodes provided in the semiconductor integrated circuit. Such a conductive contact unit includes a conductive contact holder formed of an insulating material for holding the conductive contacts.

To realize high-speed computing, semiconductor integrated circuits in recent years have been configured to operate by an electrical signal (a high frequency signal) having a high frequency of about several hundred megahertz (MHz) to several hundred gigahertz (GHz). Further, semiconductor integrated circuits have been significantly developed to be highly integrated and miniaturized.

Under such circumstances, it is desirable for a conductive contact capable of dealing with a high-frequency signal and applicable to testing of a highly integrated and miniaturized semiconductor integrated circuit to have an external diameter as small as possible. This arrangement, however, causes a problem of its durability and difficulties in assembly. To overcome the problem, there has been disclosed a conventional technology which provides a pipe-like member having insulating properties around the conductive contact (see, for example, Patent Documents 1 and 2).

Patent Document 1: Japanese Patent Application Laid-open No. 2001-99889
Patent Document 2: Japanese Patent Application Laid-open No. 2005-49163

SUMMARY OF THE INVENTION

Because the pipe member provided around the conductive contact is made to have a small diameter of about several hundred micrometers, the above conventional technology has difficulties in manufacturing the pipe member of such a small diameter. Further, even if the pipe member of such a small diameter can be manufactured, the pipe member may be deformed when assembled to a holder base plate. Thus, the difficulties in assembly have not been overcome.

The present invention has been achieved to solve the above problems in the conventional technology and it is an object of the present invention to provide a conductive contact holder having a simple and easily assembled structure and capable of dealing with a high-frequency, signal and with high integration and miniaturization of a test object.

According to an aspect of the present invention, a conductive contact holder that holds a signal conductive contact for inputting and outputting a signal to and from a circuit, and a ground conductive contact for supplying ground potential to the circuit, includes: an insulating holder member that is made of an insulating material, and includes a first insertion hole through which the signal conductive contact is directly inserted over substantially full length thereof; and a conductive block member that is made of a conductive material, and includes a second insertion hole through which the ground conductive contact is inserted in partial contact therewith.

In the conductive contact holder, the insulating holder member may include a first holder member and a second holder member that are stacked along a longitudinal direction of the first insertion hole, and the conductive block member may be located between the first holder member and the second holder member.

In the conductive contact holder, part of the conductive block member may be exposed on a surface of the conductive contact holder.

The conductive contact holder, may further include a conductive hollow block member that is made of a conductive material. The conductive hollow block member includes a recess in which an end of a second ground conductive contact having a full length shorter than a full length of the ground conductive contact is inserted, and a hollow portion in which the conductive block member is arranged. In the hollow portion, the conductive block member and at least part of the first insertion hole formed in the insulating holder member are arranged.

In the conductive contact holder, part of the conductive hollow block member may be exposed on a surface of the conductive contact holder.

In the conductive contact holder, the conductive block member may include a recess in which an end of the second ground conductive contact is inserted.

In the conductive contact holder, the insulating holder member and the conductive hollow block member may be fixed with at least one of a screw and an adhesive.

According to an aspect of the present invention, it is possible to deal with a high-frequency signal and with high integration and miniaturization of a test object with a simple and easily assembled structure.

EXPLANATIONS OF LETTERS OR NUMERALS 1, 9, 10, 11 Conductive contact holder
2, 2-2, 2-3, 3, 3-2, 3-3, 3-4 Holder member
2a, 3a Contacting portion
2b, 3b Base portion
2c, 3c Protruding portion
4, 4-2, 4-3, 5, 5-2, 45 Block member
6 Signal conductive contact 7, 8 Ground conductive contact
21, 22, 31, 32, 33, 36, 41 Insertion hole
21a, 22a, 31a, 32a, 33a Small diameter portion
21b, 22b, 31b, 32b, 33b Large diameter portion
23, 24, 34, 35, 51 Screw hole
42, 52 Recess
45a First member
45b Second member
45c Link portion
61, 62, 71, 72, 81, 82 Needle member
61a, 62a, 71a, 72a, 81a, 82a Flange
63, 73, 83 Spring member
63a, 73a, 83a Tight winding portion
63b, 73b, 83b Coarse winding portion
91, 92 Screw
100 Semiconductor integrated circuit
101, 102 Connecting electrode
200 Circuit board
201, 202, 203 Electrode Various exemplary embodiments for carrying out the invention will be described with reference to the accompanying drawings. Note that the drawings are schematic and the relationship between the thickness and the width of elements, the ratio of the thicknesses of the elements, and the like may be different from those actually measured. Needless to say, some elements may be different in the dimensional relationship or ratio in the drawings.

Figure 1:
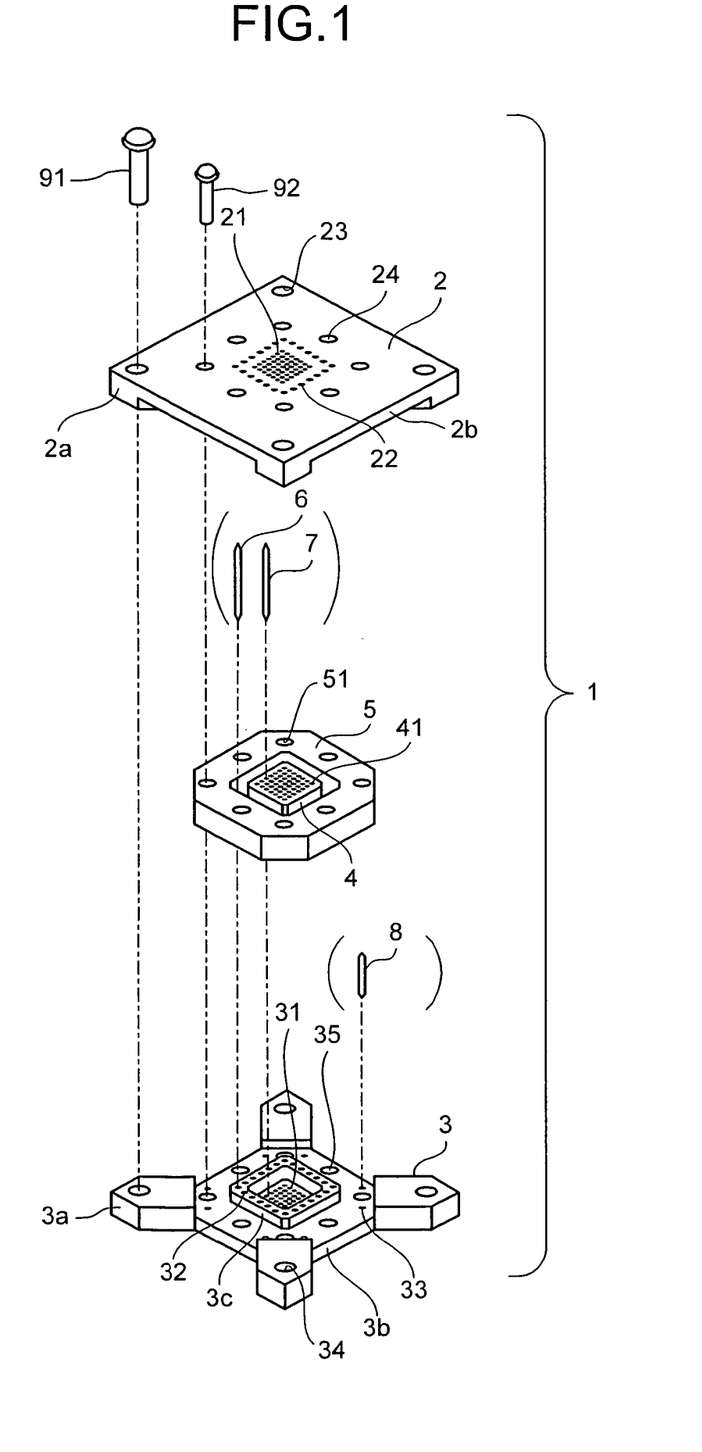
FIG. 1 is an exploded perspective view of a structure of a conductive contact holder according to an embodiment of the present invention.
Figure 2:
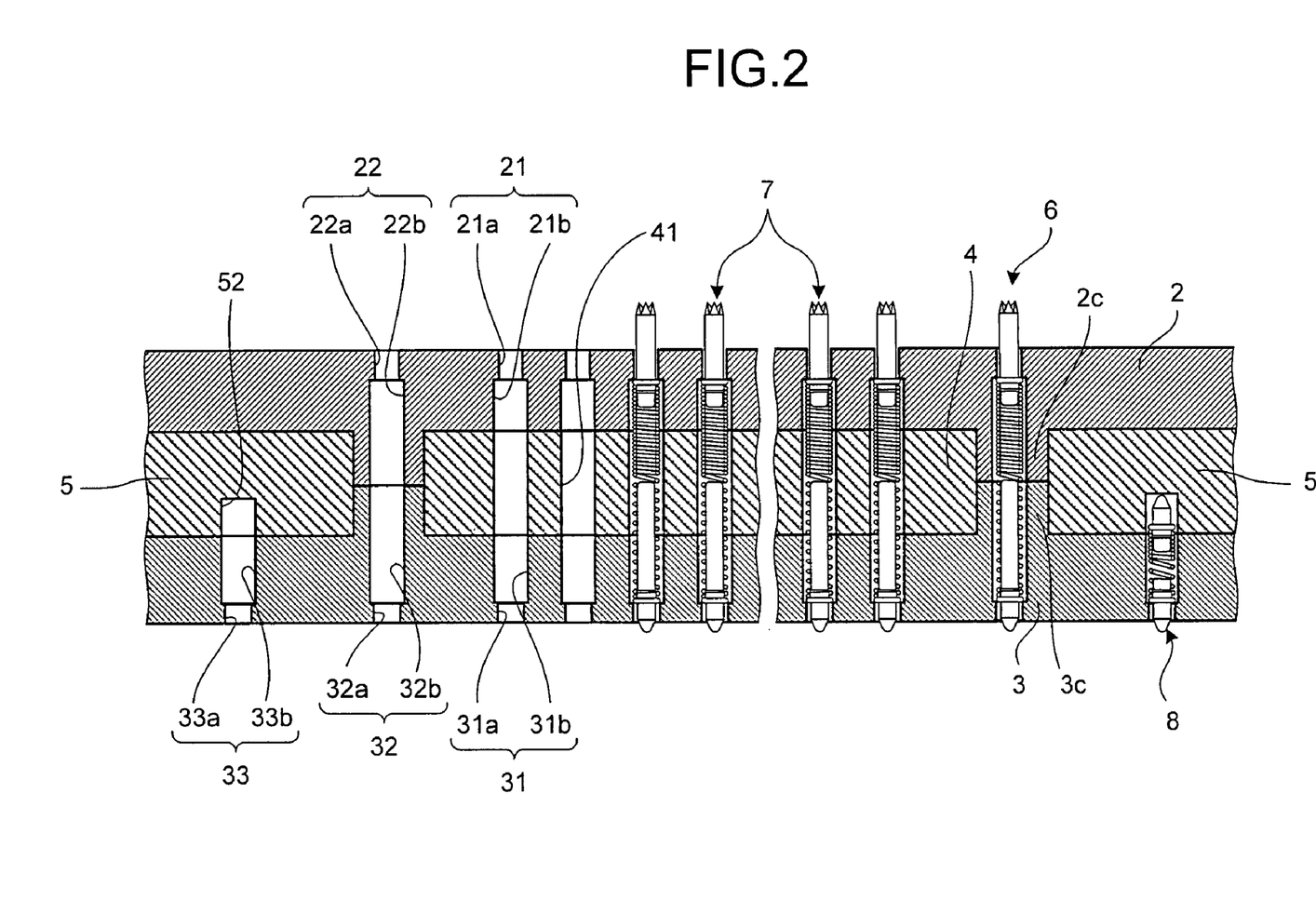
FIG. 2 is a schematic partial cross-sectional view of relevant portions of the conductive contact holder according to the embodiment of the present invention.
Figure 3:
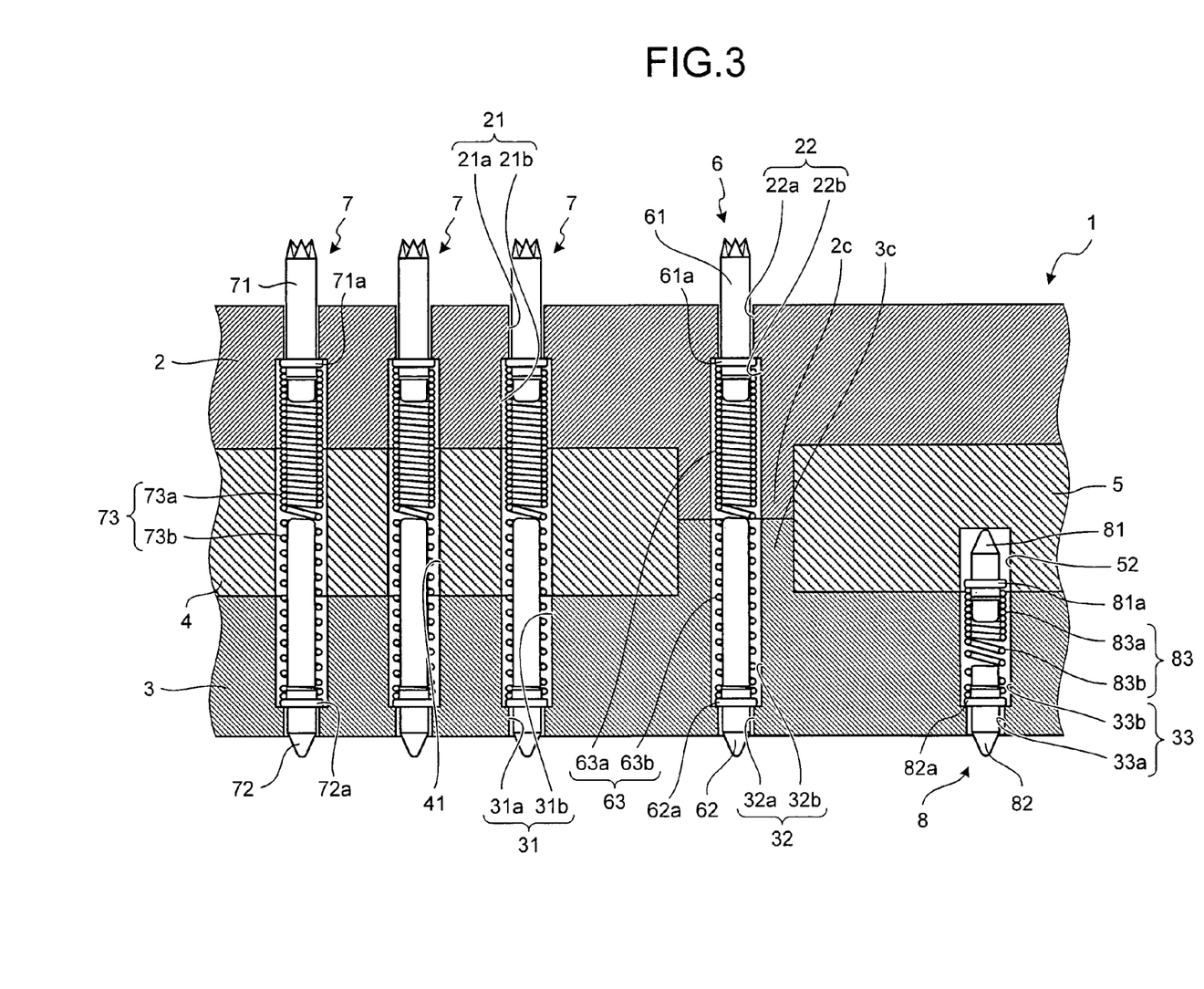
FIG. 3 is a partial enlarged view of FIG. 2.

FIG. 1 is an exploded perspective view of a structure of a conductive contact holder according to an embodiment of the present invention. FIG. 2 is a vertical cross-sectional view of relevant portions of the conductive contact holder according to the present embodiment. FIG. 3 is a partial enlarged view of FIG. 2. A conductive contact holder 1 shown in FIGS. 1 to 3 constitutes at least part of a conductive contact unit that tests electrical characteristics of a predetermined circuit typified by a semiconductor integrated circuit such as an IC chip. According to predetermined patterns, the conductive contact holder 1 contains and holds a plurality of conductive contacts that transmit and receive an electrical signal between a semiconductor integrated circuit being a test object and a circuit board on which a test circuit is mounted. When the conductive contact holder 1 is used to test a semiconductor integrated circuit, a guiding member (not shown) is provided on an outer periphery of a top-surface of FIG. 1 for preventing positional deviation of the semiconductor integrated circuit, while a circuit board including a test circuit is provided on a bottom-surface of FIG. 1. As a whole, a conductive contact unit of a socket type is constituted. In FIG. 2, part of the conductive contacts held in the conductive contact holder is omitted from illustration.

The following describes a specific structure of the conductive contact holder 1. The conductive contact holder 1 includes two holder members 2 and 3 that are made of an insulating material such as a highly insulating synthetic resin material, and stacked in a through-thickness direction thereof; and two block members 4 and 5 that are positioned between the holder members 2 and 3, and made of a conductive material. One of the holder members 2 and 3 is a first holder member, and the other is a second holder member. As a whole, an insulating holder member is constituted.

The holder member 2 includes: contacting portions 2a that come in contact with corresponding portions of the other holder member 3; a base portion 2b that comes in contact with top surfaces of the block members 4 and 5, and allows one end of the conductive contacts inserted through the holder member 3 and the block member 4 to penetrate therethrough; and a protruding portion 2c protruding from, among surfaces of the base portion 2b, a surface that faces the holder member 3. On the base portion 2b, a plurality of insertion holes 21 and 22 for inserting the conductive contacts are formed according to predetermined patterns. At predetermined positions on the holder member 2 are formed screw holes 23 (four in FIG. 1) for inserting screws 91 with which the holder members 2 and 3 are fastened, and screw holes 24 (eight in FIG. 1) for inserting screws 92 with which the holder members 2 and 3 are fastened with the block member 4 between them. Although FIG. 1 depicts only one of the screws 91 and one of the screws 92 for simplicity of illustration, needless to say, the screws 91 and 92 suitable for the screw holes 23 and 24 are actually fitted thereto.

The insertion holes 21 are provided such that their opening faces are arranged in a substantially matrix near a center portion of the base portion 2b. Each of the insertion holes 21 is formed of a stepped hole, having a diameter varying along a penetration direction thereof. Specifically, each of the insertion holes 21 includes a small diameter portion 21a having an opening on a top-end surface of the conductive contact holder 1, and a large diameter portion 21b having a diameter larger than that of the small diameter portion 21a. The insertion holes 22 are provided such that their opening faces form a substantially square shape surrounding the insertion holes 21. Each of the insertion holes 22 is formed of a stepped hole, having a diameter varying along a penetration direction thereof, as in the insertion holes 21. Thus, each of the insertion holes 22 includes a small diameter portion 22a and a large diameter portion 22b.

The holder member 3 includes contacting portions 3a that come in contact with the contacting portions 2a of the holder member 2, a base portion 3b on which the block members 4 and 5 are arranged, and a protruding portion 3c protruding from, among surfaces of the base portion 3b, a surface that faces the holder member 2. On the base portion 3b, a plurality of insertion holes 31 and 32 for inserting the conductive contacts are formed according to respective predetermined patterns to allow one ends of the conductive contacts inserted through the holder member 2 and the block member 5 to penetrate from a bottom surface of the base portion 3b. On a periphery of the base portion 3b are formed a plurality of insertion holes 33 for inserting the conductive contacts inserted through the block member 5 arranged over the base portion 3b.

At predetermined positions on the holder member 3 are formed screw holes 34 (four in FIG. 1) for inserting the screws 91 with which the holder members 2 and 3 are fastened, and screw holes 35 (eight in FIG. 1) for inserting the screws 92 with which the holder members 2 and 3 are fastened with the block member 4 between them.

Each of the insertion holes 31 formed in the base portion 3b includes a small diameter portion 31a having an opening on the bottom surface of the conductive contact holder 1, and a large diameter portion 31b having a diameter larger than that of the small diameter portion 31a. Similarly, each of the insertion holes 33 formed in the base portion 3b includes a small diameter portion 33a and a large diameter portion 33b. Each of the insertion holes 32 formed in the protruding portion 3c includes a small diameter portion 32a and a large diameter portion 32b. In the arrangements shown in FIGS. 2 and 3, the large diameter portions 31b and 32b have the same diameters as the large diameter portions 21b and 22b, respectively.

A top surface of the protruding portion 3c is brought into contact with a bottom surface of the protruding portion 2c of the holder member 2 when assembled. The formation pattern of the insertion holes 32 corresponds to the formation pattern of the insertion holes 22 of the base portion 2b in the holder member 2. Thus, when assembled, the insertion holes 22 and the insertion holes 32 coaxially communicate with each other. Each set of the communicating insertion holes 22 and 32 constitutes a first insertion hole. Among the conductive contacts, a signal conductive contact 6 transmitting and receiving an electrical signal is directly inserted over substantially its full length through the first insertion hole via no other members. In this sense, the protruding portions 2c and 3c constitute at least part of the first insertion hole thus formed.

The diameter of the protruding portions 2c and 3c is defined depending on various conditions such as the materials of the holder members 2 and 3 and of the block members 4 and 5, the diameter of the conductive contacts, and the through thickness of the conductive contact holder 1. FIG. 2, etc. illustrate an example only.

The holder members 2 and 3 are preferably made of an insulating material such as a resin material, machinable ceramics, or Teflon (registered trademark) that have good sliding properties. This reduces the sliding resistance of the conductive contacts during their expansion and contraction movement, enabling the conductive contacts to move smoothly.

The following describes structures of the block members 4 and 5. The block member 4 made of an insulating material has a substantially rectangular solid shape. The block member 4 includes insertion holes 41 that are arranged such that their opening faces form the same pattern as the opening faces of the insertion holes 21. The insertion holes 41 are combined and communicated with the insertion holes 21 of the holder member 2 and the insertion holes 31 of the holder member 3, thus sharing axis lines parallel to the through-thickness direction of the conductive contact holder 1. As such, each set of the insertion holes 21, 31, and 41 allows insertion of, among the conductive contacts, a ground conductive contact 7 that supplies ground potential. Thus, each of the insertion holes 41 formed in the block member 4 serves as a second insertion hole through which the ground conductive contact 7 is inserted being in partial contact therewith. In this sense, the block member 4 is a conductive block member.

In contrast, the block member 5 has top and bottom surfaces of a substantially square ring shape, including a hollow portion in which the block member 4 having the above structure is arranged. In a space between the block members 4 and 5, the protruding portion 2c of the holder member 2 and the protruding portion 3c of the holder member 3 are fitted such that their end surfaces make contact with each other. Further, the block member 5 includes recesses 52 having opening faces at positions facing the insertion holes 33 formed in the holder member 3. In each of the recesses 52, a ground conductive contact 8 having a full length shorter than that of the ground conductive contact 7 is inserted. Thus, the block member 5 is a conductive hollow block member that is made of a conductive material, and that includes the recesses in each of which an end of the ground conductive contact 8 serving as a second ground conductive contact is inserted, and a hollow portion in which the block member 4 can be arranged.

In the block member 5, screw holes 51 (eight in FIG. 1) for inserting the screws 92 with which the holder members 2 and 3 are fastened are formed at positions corresponding to the screw holes 24 and 35.

The block members 4 and 5 are made of a conductive material having high strength, durability, and a small thermal expansion coefficient. For example, low-thermal expansion metal, such as invar or koval (registered trademark), semiconductor, ceramic, or glass may be used.

The block members 4 and 5 having the above structure has a function for improving the strength of the conductive contact holder, and also a function for shielding electromagnetic waves. Theses functions prevent electromagnetic waves produced and radiated when an electrical signal passes through the conductive contact and externally transmitted electromagnetic waves from reaching the other conductive contacts. To fully exhibit the function for shielding the electromagnetic waves, it is preferable that the block members 4 and 5 have a small volume resistivity of about 1 $\mu\Omega\cdot$cm to about 100 $\mu\Omega\cdot$cm.

The following describes structures of conductive contacts held in the conductive contact holder 1. The conductive contacts applied in the present embodiment are roughly classified into: signal conductive contacts 6 that input and output a testing electrical signal and supply electric power; the ground conductive contacts 7 that supply ground potential to a test object; and ground conductive contacts 8 (second ground conductive contacts) each having a full length shorter than that of the ground conductive contacts 7.

Each of the signal conductive contacts 6 includes: a needle member 61 that comes in contact with a connecting electrode on a semiconductor integrated circuit being a test object; a needle member 62 that comes in contact with an electrode on a circuit board; and a spring member 63 that is provided between the needle members 61 and 62 and extends and contracts to connect the two needle members 61 and 62. The needle members 61 and 62 and the spring member 63 share the same axis line. During testing, each spring member 63 is extended and contracted in a direction along this axis line, thereby cushioning the impact to be applied to each connecting electrode on the semiconductor integrated circuit.

Each of the needle members 61 has a tip end having a plurality of nails protruding in a direction pointed by the tip to securely hold the connecting electrode (having, for example, a spherical shape) on the semiconductor integrated circuit being positioned above during testing. On the other hand, on a base end of the needle member 61 is provided a flange 61a that comes in contact with an end of the spring member 63. The flange 61a comes in contact with a stepped portion, i.e., an interface between the large diameter portion 22b and the small diameter portion 22a, of the insertion hole 22, thereby serving to retain the signal conductive contact 6 inside the holder member 3.

Each of the needle members 62 has a tip end that comes in contact with the electrode on the circuit board. The needle member 62 can be moved in the axial direction due to the expansion and contraction behavior of the spring member 63. Further, the needle member 62 is urged in an electrode direction due to the elastic force of the spring member 63, and brought into contact with an electrode on the circuit board with a reduced contact resistance. On the needle member 62 is provided a flange 62a that comes in contact with a stepped portion, i.e., an interface between the large diameter portion 32b and the small diameter portion 32a, of the insertion hole 32, thereby serving to retain the signal conductive contact 6 inside the holder member 3.

Each of the spring members 63 has a tight winding portion 63a close to the needle member 61, and a coarse winding portion 63b close to the needle member 62. The tight winding portion 63a has an end that comes in contact with the flange 61a, and the coarse winding portion 63b has an end that comes in contact with the flange 62a. The needle members 61 and 62 and the spring member 63 are connected with each other by winding force of the spring, or by soldering, welding, or the like.

Each of the ground conductive contacts 7 includes needle members 71 and 72, and a spring member 73 that extends and contacts to connect the needle members 71 and 72. The needle members 71 and 72 and the spring member 73 have the same structures as the needle members 61 and 62 and the spring member 63, respectively. Thus, the needle members 71 and 72 include flanges 71a and 72a, respectively, thereby serving to retain the ground conductive contacts 7 inside the conductive contact holder 1.

Each of the ground conductive contacts 8 includes two needle members 81 and 82 having substantially the same shape, and a spring member 83 that extends and contacts to connect the needle members 81 and 82. The ground conductive contacts 8 are inserted to grooves, formed as the insertion holes 33 of the base portion 3b and the recesses 52 of the block member 5. The needle members 81 and 82 have base ends where flanges 81a and 82a are formed, respectively. Each of the spring members 83 includes a tight winding portion 83a and a coarse winding portion 83b. The needle members at the upper portions of the ground conductive contacts 8 are not necessarily the needle members 81 because tip ends thereof are in contact with bottom surfaces of the recesses 52.

To manufacture the conductive contact holder 1 having the above structure, the various inserting holes and screw holes are formed in the holder members 2 and 3 and the block members 4 and 5. To this end, the insulating material and the conductive material both serving as base materials are subjected either to drilling, etching or blanking, or to processing using laser, electron beam, ion beam, wire electrical discharge, etc.

For assembly after forming the various insertion holes and screw holes, the block members 4 and 5 are sandwiched by the holder members 2 and 3, and are fastened at predetermined portions with the screws 91 and 92. The block member 4 is arranged in the hollow portion of the block member 5, and the position of the block member 4 is fixed, with its side surfaces surrounded by the protruding portion 2c of the holder member 2 and the protruding portion 3c of the holder member 3. Thus, the block member 4 need not be fastened to other members with screws or the like. The holder members 2 and 3 may be assembled to the block members 4 and 5 using a suitable adhesive, instead of using the screws 91 and 92. Alternatively, both the screws and the adhesive may be used to assemble the conductive contact holder 1. Other than the screws and the adhesive, a fastening member such as a resin rivet, a pressure fit pin, or a snap fit may be used to fasten the holder members 2 and 3 to the block member 5.

To assemble the conductive contact holder 1, positioning of the block members 4 and 5 and the holder members 2 and 3 is necessary. To perform the positioning, a positioning hole is formed that provides communication with the block members 4, the holder member 2 and/or the holder member 3 all sharing the same axis line, and a positioning pin is inserted in the positioning hole. After positioned in this way, the members are fastened with the screws 91 and 92. This enables the positioning with higher accuracy.

Figure 4:
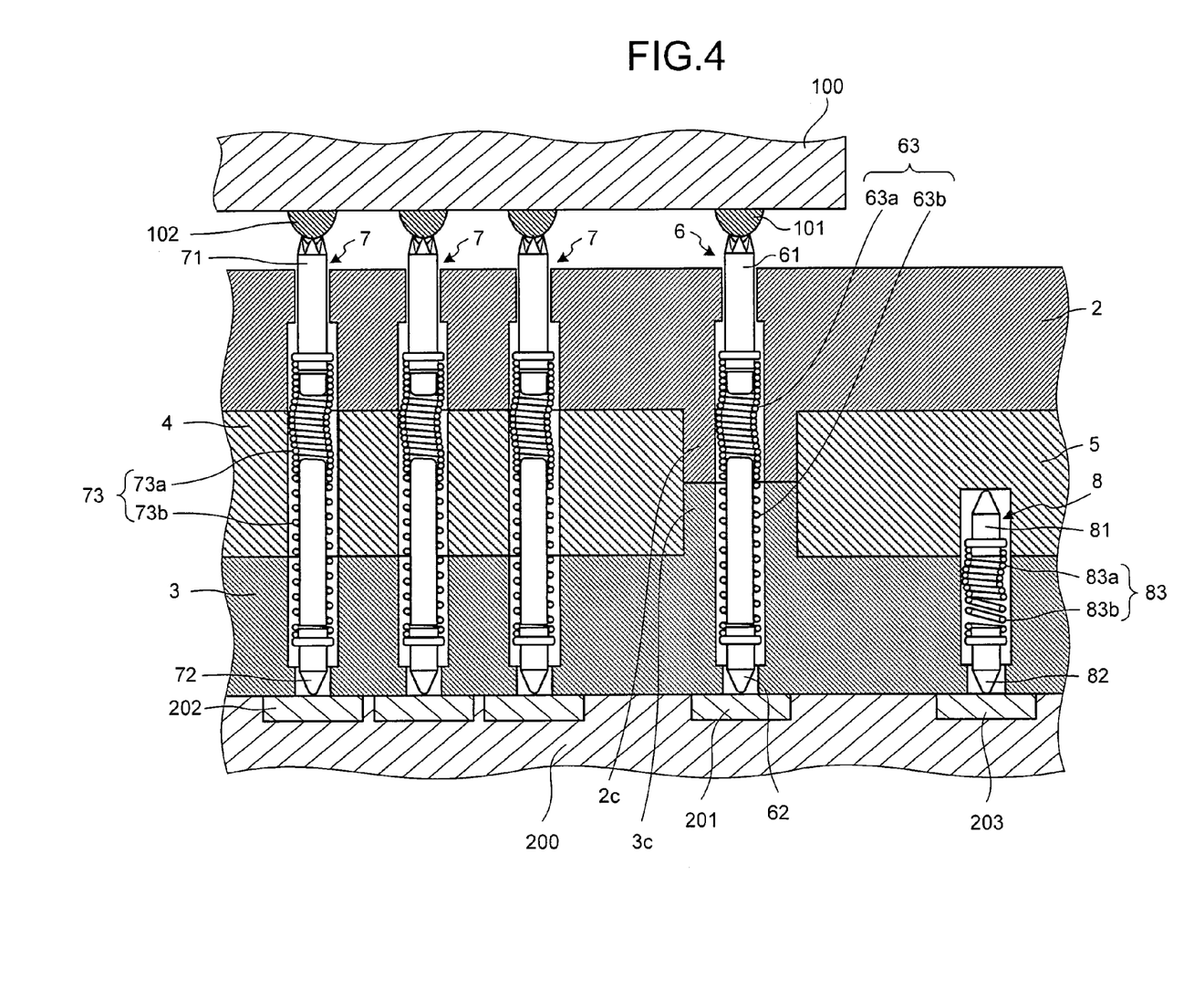
FIG. 4 is a schematic diagram of the conductive contact holder when used for testing according to the embodiment of the present invention.

FIG. 4 is a schematic diagram of the conductive contact holder 1 having the above structure and being used for testing. Regarding the conductive contact holder 1, FIG. 4 is an enlarged cross-sectional view of the portion shown in FIG. 3. From above the conductive contact holder 1, a semiconductor integrated circuit 100, i.e., a test object, is attached, and spherical connecting electrodes 101 are brought into contact with tips of the needle members 61 of the signal conductive contacts 6. Similarly, spherical connecting electrodes 102 are brought into contact with tips of the needle members 71 of the ground conductive contacts 7. Further, electrodes 201 on a circuit board 200 are brought into contact with tips of the needle members 62 of the signal conductive contacts 6, electrodes 202 on the circuit board 200 are brought into contact with tips of the needle members 72 of the ground conductive contacts 7, and electrodes 203 on the circuit board 200 are brought into contact with tips of the needle members 82 of the ground conductive contacts 8.

In the state shown in FIG. 4, the spring members 63, 73, and 83 are contracted in the axial direction thereof. When contracted, the spring members 63, 73, and 83 are slightly deflected in a direction (a lateral direction in FIG. 4) orthogonal to the axial direction. Accordingly, the spring members 73 are brought into direct contact with the block member 4, so that the ground conductive contacts 7 are electrically connected to the block member 4. As a result, the ground potential to be provided by the ground conductive contacts 7 becomes equal to the potential of the block member 4. The ground conductive contacts 8 supply the ground potential being equal to the potential of the block member 5 because the tips of the needle members 81 come in contact with the block member 5. As a result, a strong ground is provided around the signal conductive contacts 6, enabling to reduce the crosstalk between the adjoining signal conductive contacts 6. This prevents loss of signals transmitted between the semiconductor integrated circuit 100 and the circuit board 200, thereby achieving improved electrical characteristics of the conductive contact holder 1. The block members 4 and 5 may have a suitable thickness depending on the electrical characteristics required for the conductive contact holder 1.

Figure 5:
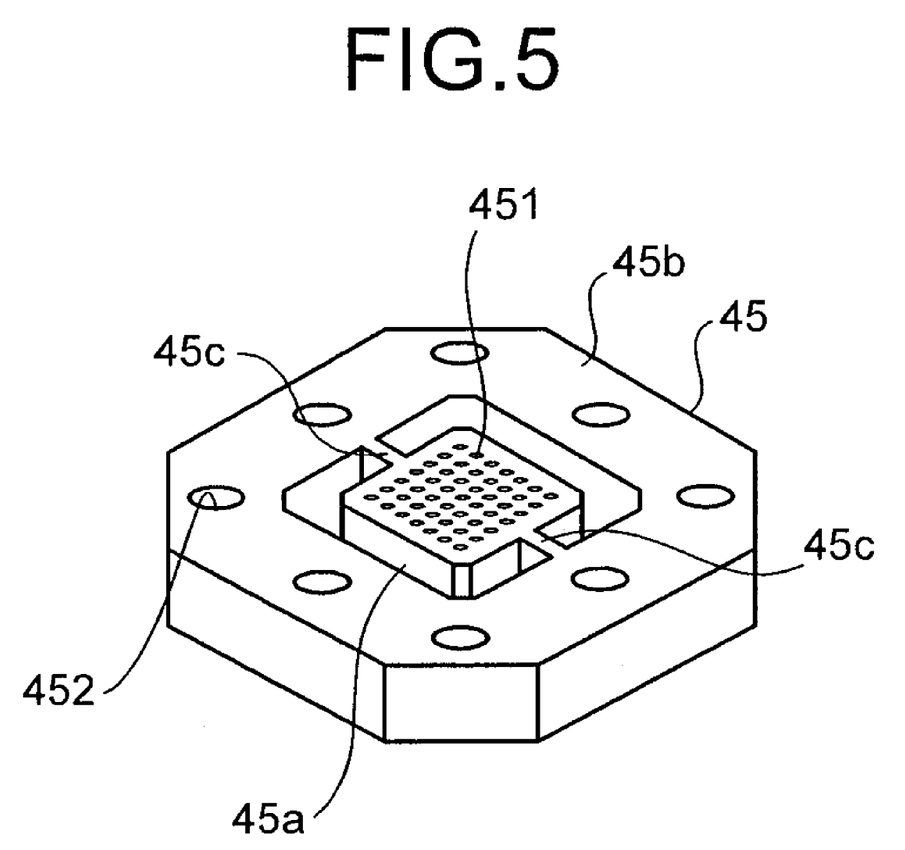
FIG. 5 is a schematic diagram of an example of a conductive block member and a conductive hollow block member being connected to each other.

According to an arrangement pattern of the signal conductive contacts 6, the conductive block member and the conductive hollow block member may be connected in advance. FIG. 5 is a schematic diagram of an example of the conductive block member. A block member 45 shown in FIG. 5 includes a first member 45a corresponding to the block member 4 (conductive block member) shown in FIG. 1, a second member 45b corresponding to the block member 5 (conductive hollow block member) shown in FIG. 1, and link portions 45c that are made of the same conductive material as those of the first member 45a and the second member 45b, and that link and connect the first member 45a to the second member 45b. In the first member 45a are provided insertion holes 451 for inserting the ground conductive contacts 7. In the second member 45b, screw holes 452 (eight in FIG. 5) for inserting the screws 92 with which the holder members 2 and 3 are fastened are formed at positions corresponding to the screw holes 24 and 35. When the block member 45 is used to constitute a conductive contact holder, the protruding portion 2c of the holder member 2 and the protruding portion 3c of the holder member 3 need to have cutouts that can fit to the link portions 45c.

The ground conductive contacts 7 and 8 have extremely small structures due to the high integration and miniaturization of the semiconductor integrated circuit 100. Thus, the volumes of the ground conductive contacts 7 and 8 are negligible for the volumes of the block members 4 and 5. Further, the potential of the block members 4 and 5, generated by the electric charges given by the ground conductive contacts 7 and 8 can be regarded as a variable value being nearly zero. In other words, the potential of the ground conductive contacts 7 and 8, i.e., the potential of the block members 4 and 5, is stably maintained at the ground potential.

The above embodiment of the present invention enables to provide a conductive contact holder including: an insulating holder member that is made of an insulating material, and includes a first insertion hole through which a signal conductive contact inputting and outputting a signal to and from a circuit is directly inserted over substantially its full length; and a conductive block member that is made of a conductive material, and includes a second insertion hole through which the ground conductive contact is inserted being in partial contact therewith. With such a simple structure facilitating assembly, the conductive contact holder is capable of dealing with a high-frequency signal and with high integration and miniaturization of a test object.

According to the present embodiment, the insertion holes for inserting the signal conductive contacts are formed directly in the insulating holder member. Thus, coaxial structures can be formed easily even when the conductive contacts are arranged at a narrow pitch of being equal to or less than several hundred micrometers. This eliminates the need to provide insulating pipe members as in the conventional technology, thus reducing manufacturing costs.

The block members 4 and 5 have any thickness in the axial direction through which the conductive contacts are inserted. For example, the block members 4 and 5 may have a thickness nearly equal to the thickness of the conductive contact holder 1. In this case, it is possible to shield electromagnetic waves from the signal conductive contact 6 more significantly.

The foregoing describes the signal conductive contacts 6 without distinguishing the conductive contacts for electrical signal use and the conductive contacts for power supply. Regarding the durability of current, there may be a case that the conductive contacts for power supply preferably have a diameter larger than that of the conductive contacts for electrical signal use. In this case, the insertion holes may be formed such that the insertion holes for inserting the conductive contacts for electrical signal use and the insertion holes for inserting the conductive contacts for power supply have different diameters according to a wiring pattern on a test object.

The ground conductive contacts 7 may have an external diameter larger than that of the signal conductive contacts 6. This is because the ground conductive contacts 7 have no need to perform impedance matching of the characteristics impedance, and therefore the external diameter thereof can be increased as much as possible regarding the strength, durability, and electrical conductivity.

The above conductive contacts are described as examples only, and the present embodiment is applicable to various known conductive contacts.

In addition, the present embodiment assumes that the conductive contact unit is used to test a semiconductor integrated circuit. Needless to say, the conductive contact unit is applicable to a high-density probe unit used to test a package board or wafer level on which a semiconductor chip is mounted as a test object.

Modifications

Figure 6:
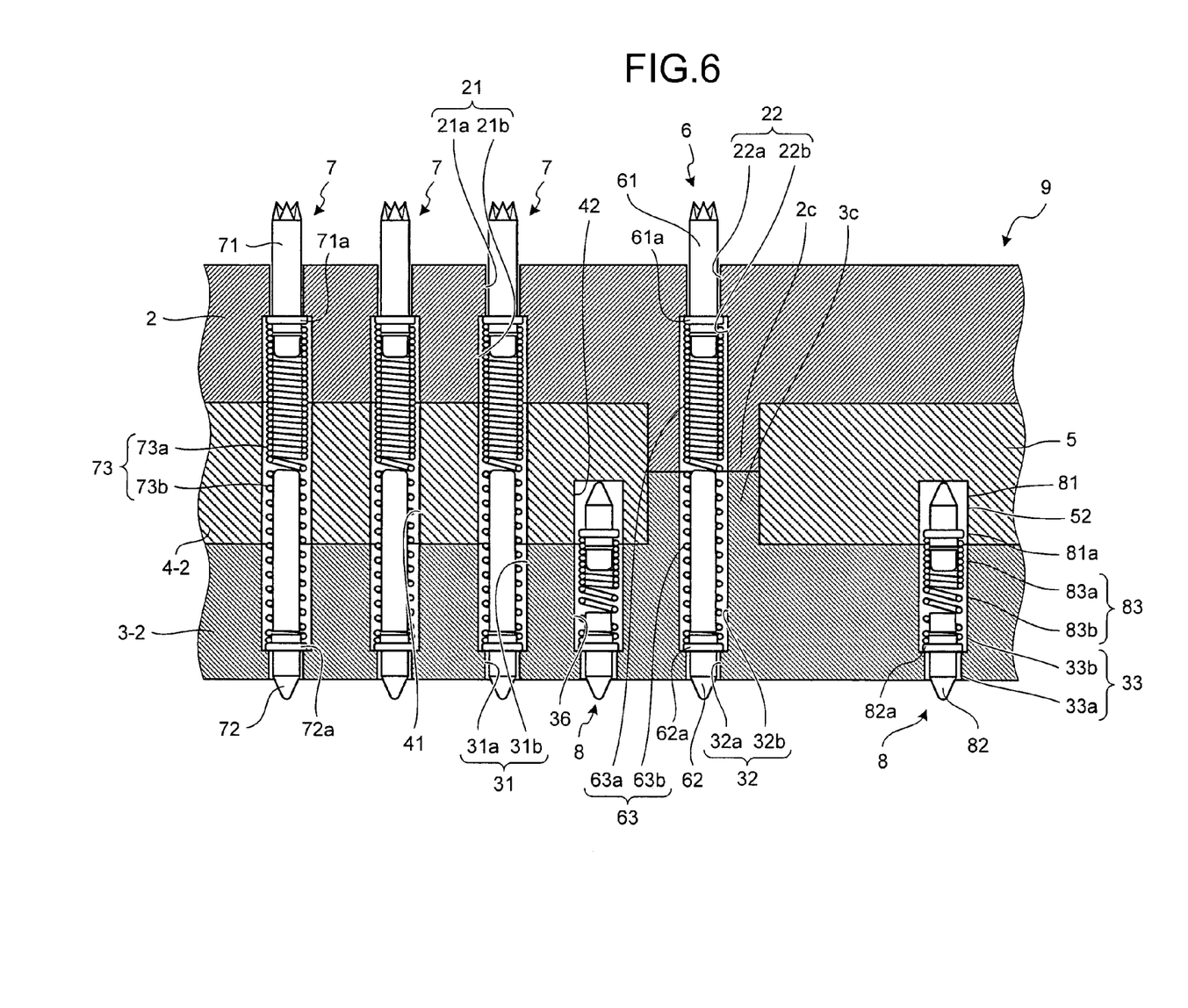
FIG. 6 is a schematic diagram of a structure of a conductive contact holder according to a first modification the embodiment of the present invention.

The following describes modifications of the conductive contacts according to the present embodiment. FIG. 6 is a schematic diagram of relevant portions of a conductive contact holder according to a first modification of the present invention. A conductive contact holder 9 shown in FIG. 6 has a feature that the ground conductive contacts 8 having a short full-length are inserted also in a block member 4-2 (conductive block member) through which the ground conductive contacts 7 having a long full-length are inserted. In this case, insertion holes 36 for inserting the ground conductive contacts 8 are formed in a holder member 3-2, and recesses 42 allowing insertion of tips of the ground conductive contacts 8 are formed in the block member 4-2. With the above structure, the conductive contact holder 9 can provide a further stronger ground.

Figure 7:
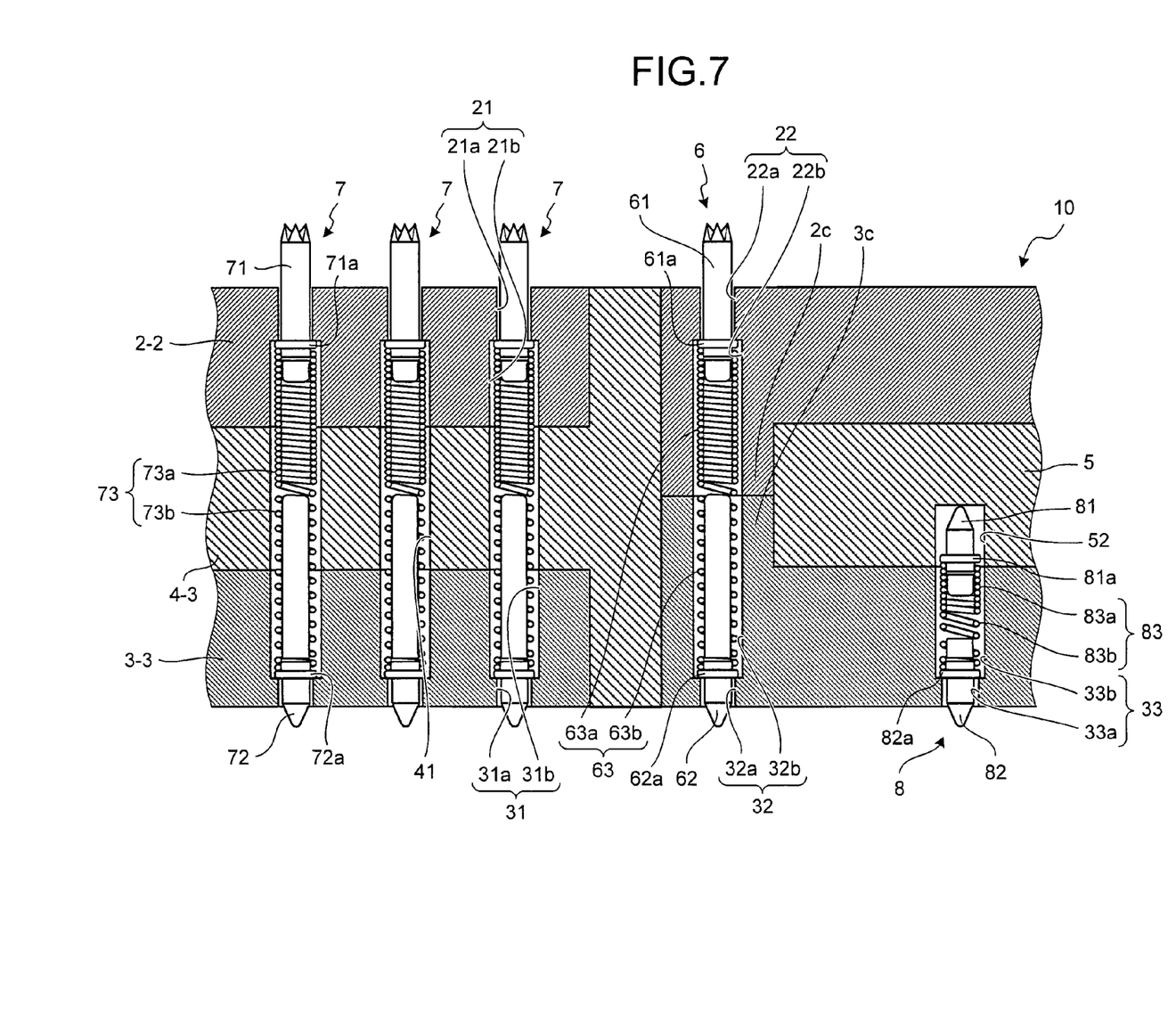
FIG. 7 is a schematic diagram of a structure of a conductive contact holder according to a second modification of the embodiment of the present invention.

FIG. 7 is a schematic diagram of relevant portions of a conductive contact holder according to a second modification of the present embodiment. In a conductive contact holder 10 shown in FIG. 7, an outer periphery of a block member 4-3 (conductive block member) allowing insertion of the ground conductive contacts 7 is partially extended out in the through-thickness direction near the signal conductive contacts 6 to be exposed on surfaces of the conductive contact holder 10. In this case, holder members 2-2 and 3-3 have shapes that can fit to the portions of the block member 4-3 that are exposed outside. With the above structure, the conductive contact holder 10 can shield electromagnetic waves more reliably. Depending on the structure of the semiconductor integrated circuit and the circuit board both connected to the conductive contact holder 10, an insulating film for preventing a short circuit is provided on the portions of the block member 4-3 that are exposed outside.

Figure 8:
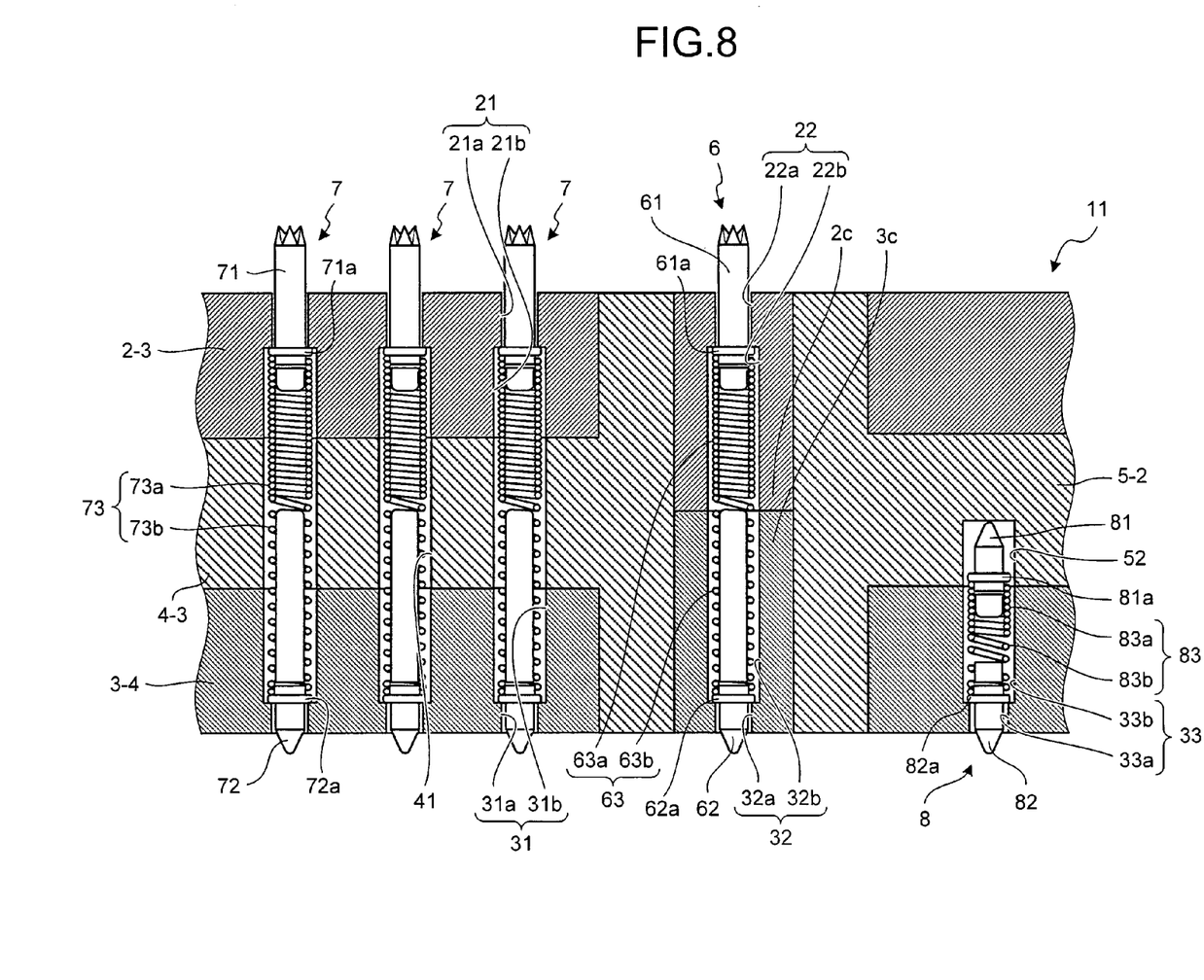
FIG. 8 is a schematic diagram of a structure of a conductive contact holder according to a third modification of the embodiment of the present invention.

FIG. 8 is a schematic diagram of relevant portions of a conductive contact holder according to a third modification of the present embodiment. In a conductive contact holder 11 shown in FIG. 8, the outer periphery of the block member 4-3 is partially exposed on surfaces of the conductive contact holder 11. Further, an inner periphery of a block member 5-2 (conductive hollow block member) allowing insertion of the ground conductive contacts 8 is partially extended out in the through-thickness direction near the signal conductive contacts 6, to be exposed on the surfaces of the conductive contact holder 11. Thus, holder members 2-3 and 3-4 have shapes that can fit to the portions of the block members 4-3 and 5-2 that are exposed outside. With the above structure, the conductive contact holder 11 can shield electromagnetic waves more reliably, as in the conductive contact holder 10. In this modification also, depending on the structure of the semiconductor integrated circuit and the circuit board both connected to the conductive contact holder 11, an insulating film for preventing a short circuit may be provided on the portions of the block members 4-3 and 5-2 that are exposed outside.

In FIGS. 6 to 8, elements having the same structures as those of the conductive contact holder 1 according to the first embodiment are indicated by the same reference numerals as in FIG. 3 or the like.

Although the present invention has been described with reference to a particular embodiment, it will be understood that the present invention is also capable of further and other embodiments within the spirit and scope of the appended claims.

As described, a conductive contact unit according to the present invention is preferable for holding conductive contacts used for current testing of a circuit such as a semiconductor integrated circuit.

The invention claimed is:

1. A conductive contact holder that holds a signal conductive contact for inputting and outputting a signal to and from a circuit, and a ground conductive contact for supplying ground potential to the circuit, the conductive contact holder comprising:

an insulating holder member that is made of an insulating material, and includes a first insertion hole through which the signal conductive contact is directly inserted over substantially a full length thereof; and a conductive block member that is made of a conductive material, and includes a second insertion hole through which the ground conductive contact is inserted in partial contact therewith, wherein the insulating holder member includes a first holder member and a second holder member that are stacked along a longitudinal direction of the first insertion hole, and the conductive block member is located between the first holder member and has a recess in which an end of a second ground conductive contact having a full length shorter than a full length of the ground conductive contact is inserted.

2. A conductive contact holder that holds a signal conductive contact for inputting and outputting a signal to and from a circuit, and a ground conductive contact for supplying ground potential to the circuit, the conductive contact holder comprising:
- an insulating holder member that is made of an insulating material, and includes a first insertion hole through which the signal conductive contact is directly inserted over substantially a full length thereof; and
- a conductive block member that is made of a conductive material, and includes a second insertion hole through which the ground conductive contact is inserted in partial contact therewith, wherein
- the insulating holder member includes a first holder member and a second holder member that are stacked along a longitudinal direction of the first insertion hole,
- the conductive block member is located between the first holder member and the second holder member and has a recess in which an end of a second ground conductive contact having a full length shorter than a full length of the ground conductive contact is inserted, and
- part of the conductive block member is exposed on a surface of the conductive contact holder.

3. A conductive contact holder that holds a signal conductive contact for inputting and outputting a signal to and from a circuit, and a ground conductive contact for supplying ground potential to the circuit, the conductive contact holder comprising:
- an insulating holder member that is made of an insulating material, and includes a first insertion hole through which the signal conductive contact is directly inserted over substantially a full length thereof;
- a conductive block member that is made of a conductive material, and includes a second insertion hole through which the ground conductive contact is inserted in partial contact therewith, at least part of the conductive block member being positioned in the insulating holder member; and
- a conductive hollow block member that is made of a conductive material, and includes a recess, in which an end of a second ground conductive contact having a full length shorter than a full length of the ground conductive contact is inserted, and a hollow portion, in which the conductive block member is arranged, wherein
- in the hollow portion, the conductive block member and at least part of the first insertion hole formed in the insulating holder member are aligned.

4. The conductive contact holder according to claim 3, wherein part of the conductive hollow block member is exposed on a surface of the conductive contact holder.

5. The conductive contact holder according to claim 3, wherein the conductive block member includes a recess in which an end of the second ground conductive contact is inserted.

6. The conductive contact holder according to claim 3, wherein the insulating holder member and the conductive hollow block member are fixed with at least one of a screw and an adhesive.

* * * * *